(12) United States Patent
Miura et al.

(10) Patent No.: US 12,402,413 B2
(45) Date of Patent: Aug. 26, 2025

(54) DISPLAY DEVICE AND ELECTRONIC APPARATUS WITH HIGH DENSITY PIXELS

(71) Applicant: Sony Semiconductor Solutions Corporation, Kanagawa (JP)

(72) Inventors: Kiwamu Miura, Kanagawa (JP); Naobumi Toyomura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 81 days.

(21) Appl. No.: 18/452,910

(22) Filed: Aug. 21, 2023

(65) Prior Publication Data

US 2024/0032343 A1     Jan. 25, 2024

Related U.S. Application Data

(63) Continuation of application No. 16/322,008, filed as application No. PCT/JP17/26890 on Jul. 25, 2017, now Pat. No. 11,778,862.

(30) Foreign Application Priority Data

Sep. 7, 2016    (JP) ................................. 2016-174211

(51) Int. Cl.
*H10D 86/40*      (2025.01)
*G09F 9/30*      (2006.01)
(Continued)

(52) U.S. Cl.
CPC ............. *H10D 86/481* (2025.01); *G09F 9/30* (2013.01); *G09G 3/20* (2013.01); *G09G 3/3233* (2013.01);
(Continued)

(58) Field of Classification Search
CPC ...... G09G 3/32; G09G 3/3208; G09G 3/3225; G09G 3/3233; G09G 3/3241; G09G 3/325;
(Continued)

(56) References Cited

U.S. PATENT DOCUMENTS 6,366,025 B1    4/2002   Yamada
6,630,289 B1   10/2003   Kwok et al.
(Continued)

FOREIGN PATENT DOCUMENTS

CN      101286524 A     10/2008
CN      101404140 A      4/2009
(Continued)

OTHER PUBLICATIONS

Japanese Office Action issued Jan. 12, 2021 for corresponding Japanese Application No. 2018-538272.
(Continued)

*Primary Examiner* — William B Partridge
*Assistant Examiner* — Gustavo G Ramallo
(74) *Attorney, Agent, or Firm* — Michael Best & Friedrich LLP (57) ABSTRACT

In a display device including a pixel arranged therein, the pixel including a light emitting unit in which an anode electrode is formed in the uppermost layer of a multilayer wiring structure formed by alternately stacking a plurality of insulating layers and a plurality of wiring layers, and a capacitor element electrically connected to the anode electrode of the light emitting unit, or in an electronic device including the display device, the capacitor element including a first electrode formed in a wiring layer below the anode electrode, a second electrode formed opposite to the first electrode, and attached to the anode electrode of the light emitting unit via a conductive rib, and a first insulating layer
(Continued)

interposed between the first electrode and the second electrode.

19 Claims, 8 Drawing Sheets

(51) Int. Cl.
| | |
|---|---|
| G09G 3/20 | (2006.01) |
| G09G 3/3233 | (2016.01) |
| H05B 33/02 | (2006.01) |
| H10K 50/00 | (2023.01) |
| H10K 50/11 | (2023.01) |
| H10K 59/121 | (2023.01) |
| H10K 59/123 | (2023.01) |
| H10K 59/80 | (2023.01) |

(52) U.S. Cl.
CPC .............. *H05B 33/02* (2013.01); *H10K 50/00* (2023.02); *H10K 50/11* (2023.02); *H10K 59/1213* (2023.02); *H10K 59/1216* (2023.02); *H10K 59/123* (2023.02); *H10K 59/8051* (2023.02)

(58) Field of Classification Search
CPC ...... G09G 3/3258; H10K 50/00; H10K 50/11; H10K 50/813; H10K 50/814; H10K 59/00; H10K 59/10; H10K 59/12; H10K 59/121; H10K 59/1213; H10K 59/1216; H10K 59/123; H10K 59/8051; H10K 59/80516
See application file for complete search history.

(56) References Cited

U.S. PATENT DOCUMENTS

| | | |
|---|---|---|
| 6,665,024 B2 | 12/2003 | Kurashina |
| 7,696,518 B2 | 4/2010 | Koo |
| 8,570,452 B2 | 10/2013 | Moriwaki |
| 9,142,599 B2 | 9/2015 | Koshihara et al. |
| 9,331,133 B2 | 5/2016 | Ota et al. |
| 9,634,079 B2 | 4/2017 | Ota et al. |
| 9,673,267 B2 | 6/2017 | Kim et al. |
| 9,935,163 B2 | 4/2018 | Han et al. |
| 10,051,219 B2 * | 8/2018 | Miyake .................. H04N 25/76 |
| 10,128,317 B2 | 11/2018 | Wacyk |
| 10,700,212 B2 | 6/2020 | Sawai et al. |
| 10,777,130 B2 | 9/2020 | Ota et al. |
| 2008/0074363 A1 | 3/2008 | Yamashita |
| 2008/0246403 A1 | 10/2008 | Sagawa et al. |
| 2014/0217432 A1 | 8/2014 | Ota |
| 2014/0291636 A1 | 10/2014 | Kim et al. |
| 2015/0069363 A1 | 3/2015 | Ota |
| 2015/0097172 A1 | 4/2015 | Han |
| 2016/0064467 A1* | 3/2016 | Ota ..................... H10K 59/1216 257/40 |
| 2016/0191825 A1 | 6/2016 | Sato et al. |
| 2016/0197130 A1 | 7/2016 | Gil et al. |
| 2018/0240834 A1 | 8/2018 | Tanaka et al. |
| 2022/0271086 A1* | 8/2022 | Kong .................. H10H 29/142 |

FOREIGN PATENT DOCUMENTS

| | | |
|---|---|---|
| CN | 102246128 A | 11/2011 |
| CN | 102447074 A | 5/2012 |
| CN | 102623485 A | 8/2012 |
| CN | 203659396 U | 6/2014 |
| CN | 104517996 A | 4/2015 |
| CN | 105390527 A | 3/2016 |
| CN | 113270464 A | 8/2021 |
| CN | 113314574 A | 8/2021 |
| JP | 2005227562 A | 8/2005 |
| JP | 2008287135 A | 11/2008 |
| JP | 2011-221071 A | 11/2011 |
| JP | 2013044890 A | 3/2013 |
| JP | 2014085385 A | 5/2014 |
| JP | 2014186139 A | 10/2014 |
| JP | 2015191038 A | 11/2015 |
| JP | 2016-053636 A | 4/2016 |
| JP | 2016-053640 A | 4/2016 |
| JP | 2016045304 A | 4/2016 |

OTHER PUBLICATIONS

Chinese Office Action dated Nov. 9, 2020 for corresponding Chinese Application No. 2017800530796.

Japanese Office Action issued Mar. 23, 2021 for corresponding Japanese Application No. 2018-538272.

* cited by examiner

DISPLAY DEVICE AND ELECTRONIC APPARATUS WITH HIGH DENSITY PIXELS

CROSS REFERENCE TO RELATED APPLICATIONS

This is a Continuation application of U.S. patent application Ser. No. 16/322,008, filed Jan. 30, 2019, which is a 371 National Stage Entry of International Application No.: PCT/JP2017/026890, filed on Jul. 25, 2017, which in turn claims priority from Japanese Priority Patent Application JP 2016-174211 filed on Sep. 7, 2016, the entire contents of which are incorporated herein by reference.

TECHNICAL FIELD

The present disclosure relates to a display device and an electronic device including the display device.

BACKGROUND ART

As one of display devices, there is an organic electroluminescence (hereinafter, referred to as "EL") display device using an organic EL element using an EL that is an organic material as a light emitting unit. The organic EL display device has a lower power consumption characteristic, since the organic EL element forming the light emitting unit is a self-light emitting element. The organic EL element has a structure in which an organic layer formed by stacking an organic hole transporting layer and an organic light emitting layer is provided between a first electrode and a second electrode. Then, in the organic EL display device, gradation of coloring is obtained by controlling the current value flowing through the organic EL element.

Among organic EL display devices using an organic EL element as a light emitting unit, in an active matrix type organic EL display device, a drive circuit (pixel circuit) including a plurality of transistors and a capacitor element is provided for each pixel, and driving of the organic EL element is performed by this drive circuit. Then, in order to effectively utilize the upper layer than a gate electrode of the transistor to provide a pixel structure for high density pixels, a capacitor element is formed using a wiring layer right above the gate electrode (see, for example, Patent Document 1).

CITATION LIST

Patent Document

Patent Document 1: Japanese Patent Application Laid-Open No. 2016-53640

SUMMARY OF THE INVENTION

Problems to be Solved by the Invention

Meanwhile, in ultra-compact display devices in which an interval between pixels decreases due to higher definition, or ultra-compact display devices called micro display, since the pixel size becomes small, it is difficult to sufficiently secure a capacitance value of a capacitor element. In particular, in a wiring layer right above a gate electrode of a transistor, since a capacitor element is formed avoiding other gate wiring or the like, it is difficult to efficiently form a capacitor element. As a result, there is a problem that the display quality is deteriorated due to insufficient capacity of the capacitor element.

In view of the above, an object of the present disclosure is to provide a display device capable of suppressing deterioration in display quality due to insufficient capacity of a capacitor element by efficiently forming a capacitor element and sufficiently securing a capacitance value of the capacitor element, and an electronic device including the display device.

Solutions to Problems

A display device of the present disclosure for achieving the object described above includes a pixel arranged therein, the pixel including
a light emitting unit in which an anode electrode is formed in the uppermost layer of a multilayer wiring structure formed by alternately stacking a plurality of insulating layers and a plurality of wiring layers, and
a capacitor element electrically connected to the anode electrode of the light emitting unit,
the capacitor element including
a first electrode formed in a wiring layer below the anode electrode,
a second electrode formed opposite to the first electrode, and electrically connected to the anode electrode of the light emitting unit via a contact unit, and
a first insulating layer interposed between the first electrode and the second electrode. Furthermore, an electronic device of the present disclosure for achieving the object described above is characterized by including the display device having the above-described configuration.

In the display device having the above configuration or the electronic device including the display device, the first electrode is formed in a wiring layer below the anode electrode of the light emitting unit, and the second electrode is electrically connected to the anode electrode of the light emitting unit via the contact unit, so that a region below the anode electrode of the light emitting unit can be efficiently used to form the capacitor element. Furthermore, the length of the contact unit is adjusted and an interval between the first electrode and the second electrode is arbitrarily set, so that a desired capacitance value can be easily secured as a capacitance value of the capacitor element.

Effects of the Invention

According to the present disclosure, it is possible to suppress deterioration in display quality due to insufficient capacity of a capacitor element by efficiently forming a capacitor element and sufficiently securing a capacitance value of the capacitor element.

Note that, the effect is not necessarily limited to the effect described herein, and any of the effects described in this specification may be used. Furthermore, the effects described in this specification are merely examples, and the present invention is not limited thereto, and may have additional effects.

MODE FOR CARRYING OUT THE INVENTION

Hereinafter, modes (hereinafter, referred to as "embodiments") for implementing the technology of the present disclosure will be described in detail with reference to the drawings. The technology of the present disclosure is not limited to the embodiments. In the following description, the same reference numerals will be used for the same elements or elements having the same function, and redundant description will be omitted. Note that the description will be given in the following order.

1. General explanation of display device and electronic device of the present disclosure
2. Active matrix type organic EL display device
2-1. System configuration
2-2. Pixel circuit
2-3. Holding capacitor
2-3-1. Example of forming capacitor element using wiring layer right above gate electrode
2-3-2. First embodiment
2-3-3. Second embodiment (modification of first embodiment)
2-3-4. Third embodiment (modification of second embodiment)
3. Modification
4. Electronic device of the present disclosure
4-1. Specific example 1 (example of digital still camera)
4-2. Specific example 2 (example of head mounted display)
5. Configuration that the present disclosure can have <General Explanation of Display Device and Electronic Device of the Present Disclosure>

In the display device and the electronic device of the present disclosure, the capacitor element can include a third electrode formed in a wiring layer below the first electrode, a fourth electrode formed opposite to the third electrode and electrically connected to the first electrode via a contact unit, and a second insulating layer interposed between the third electrode and the fourth electrode. At this time, it is preferable that the third electrode be electrically connected to the anode electrode and the fourth electrode be electrically connected to the second electrode.

In the display device, the driving method of the display device, and the electronic device of the present disclosure having the preferable configuration described above, the pixels can have a driving transistor for driving the light emitting unit and a writing transistor for writing a signal to the gate electrode of the driving transistor. Furthermore, the capacitor element can be connected between the gate electrode of the driving transistor and the anode electrode of light emitting unit, and hold the signal written by the writing transistor.

Moreover, in the display device, a driving method of the display device of the present disclosure having the preferable configuration described above, and the electronic device, a substrate on which the pixels are two-dimensionally arranged can be a semiconductor substrate. Furthermore, the light emitting unit can include an organic electroluminescence element.

<Active Matrix Type Display Device>

The display device of the present disclosure is an active matrix type display device in which a current flowing through an electrooptic element is controlled by an active element provided in the same pixel circuit as the electrooptic element, for example, an insulated gate field effect transistor. As the insulated gate type field effect transistor, typically, a metal oxide semiconductor (MOS) transistor and a thin film transistor (TFT) can be exemplified.

Here, described as an example is an active matrix type organic EL display device using an organic EL element that is a current driven type electrooptic element whose light emission luminance changes according to a current value flowing in the device, as a light emitting unit (light emitting element) of a pixel circuit. Hereinafter, the "pixel circuit" may be simply described as "pixel".

[System Configuration]

Figure 1:
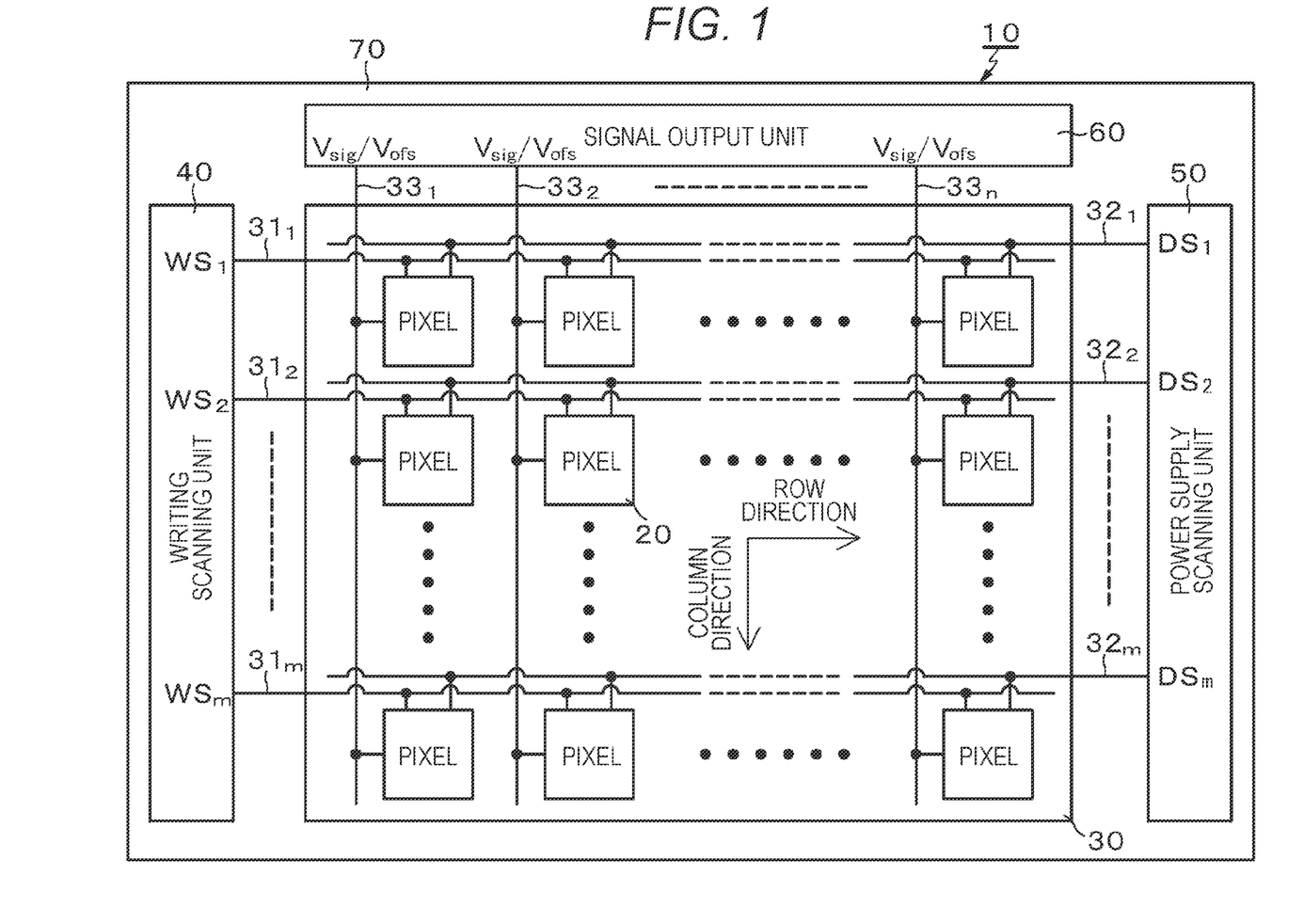
FIG. 1 is a system configuration diagram schematically showing a configuration of an active matrix type organic EL display device of the present disclosure.

FIG. 1 is a system configuration diagram schematically showing a configuration of the active matrix type organic EL display device of the present disclosure. As shown in FIG. 1, an organic EL display device 10 of the present disclosure includes a pixel array unit 30 in which a plurality of pixels 20 including organic EL elements are two-dimensionally arranged in a matrix (matrix shape), and a peripheral circuit unit arranged in a periphery of the pixel array unit 30. The peripheral circuit unit includes, for example, a writing scanning unit 40, a power supply scanning unit 50, a signal output unit 60, and the like, and drives each pixel 20 of the pixel array unit 30.

In this example, the writing scanning unit 40, the power supply scanning unit 50, and the signal output unit 60 are mounted on the same substrate as the pixel array unit 30, in other words, on a display panel 70 as a peripheral circuit of the pixel array unit 30. However, any or all of the writing scanning unit 40, the power supply scanning unit 50, and the signal output unit 60 can be provided outside the display panel 70. Furthermore, although the writing scanning unit 40 and the power supply scanning unit 50 are arranged on one side of the pixel array unit 30, the writing scanning unit 40 and the power supply scanning unit 50 can be arranged on both sides of the pixel array unit 30.

The organic EL display device 10 can be configured to be compatible with monochrome (black and white) display, or can be configured to be compatible with color display. In a case where the organic EL display device 10 is compatible with color display, one pixel (unit pixel/pixel) as a unit for forming a color image includes a plurality of sub pixels. At this time, each of the subpixels corresponds to the pixel 20 in FIG. 1. More specifically, in a display device compatible with color display, one pixel includes, for example, three sub pixels, that is, a sub pixel that emits red (R) light, a sub pixel that emits green (G) light, and a sub pixel that emits blue (B) light.

However, the one pixel is not limited to a combination of sub pixels of three primary colors of RGB, and it is also possible to form one pixel by further adding sub pixels of one or more colors to the sub pixels of three primary colors. More specifically, for example, in order to improve the luminance, a sub pixel emitting white (W) light can be added to form one pixel, or at least one sub pixel emitting complementary color light for enlarging the color reproduction range can be added to form one pixel.

In the pixel array unit 30, scanning lines 31 ($31_1$ to $31_m$), and power supply lines 32 ($32_1$ to $32_m$) are wired for each pixel row along the row direction (pixel array direction of pixel rows) with respect to the array of the pixels 20 of m rows and n columns. Moreover, signal lines 33 ($33_1$ to $33_n$) are wired for each pixel column along the column direction (pixel array direction of pixel columns) with respect to the array of the pixels 20 of m rows and n columns.

The scanning lines $31_1$ to $31_m$ are respectively connected to output ends of the corresponding rows of the writing scanning unit 40. The power supply lines $32_1$ to $32_m$ are respectively connected to output ends of the corresponding rows of the power supply scanning unit 50. The signal lines $33_1$ to $33_n$ are respectively connected to output ends of the corresponding columns of the signal output unit 60.

The writing scanning unit 40 includes a shift register circuit or the like. When writing a signal voltage of a video signal to each pixel 20 of the pixel array unit 30, the writing scanning unit 40 sequentially supplies writing scanning signals WS ($WS_1$ to $WS_m$) to the scanning lines 31 ($31_1$ to $31_m$), so that each pixel 20 of the pixel array unit 30 is sequentially scanned in units of row, that is, so-called line sequential scanning is performed.

As similar to the writing scanning unit 40, the power supply scanning unit 50 includes a shift register circuit or the like. In synchronism with the line sequential scanning by the writing scanning unit 40, the power supply scanning unit 50 supplies a power supply voltage DS ($DS_1$ to $DS_m$) capable of switching between the first power supply voltage $V_{ccp}$ and the second power supply voltage $V_{ini}$ lower than the first power supply voltage $V_{ccp}$ to the power supply lines 32 ($32_1$ to $32_m$). As described later, light emission/non-light emission (extinction) of the pixel 20 is controlled by switching $V_{ccp}/V_{ini}$ of the power supply voltage DS.

The signal output unit 60 selectively outputs a signal voltage (hereinafter, sometimes referred to simply as "signal voltage") $V_{sig}$ of a video signal corresponding to luminance information supplied from a signal supply source (not shown), and a reference voltage $V_{ofs}$. Here, the reference voltage $V_{ofs}$ is a voltage as a reference of the signal voltage $V_{sig}$ of the video signal (for example, a voltage corresponding to the black level of the video signal), and is used in the threshold correction processing as described later.

The signal voltage $V_{sig}$/reference voltage $V_{ofs}$ output from the signal output unit 60 is written to each pixel 20 of the pixel array unit 30 via the signal lines 33 ($33_1$ to $33_n$) in units of pixel rows selected by scanning by the writing scanning circuit 40. In other words, the signal output unit 60 adopts a line sequential writing drive mode in which the signal voltage $V_{sig}$ is written in units of rows (lines).

[Pixel Circuit]

Figure 2:
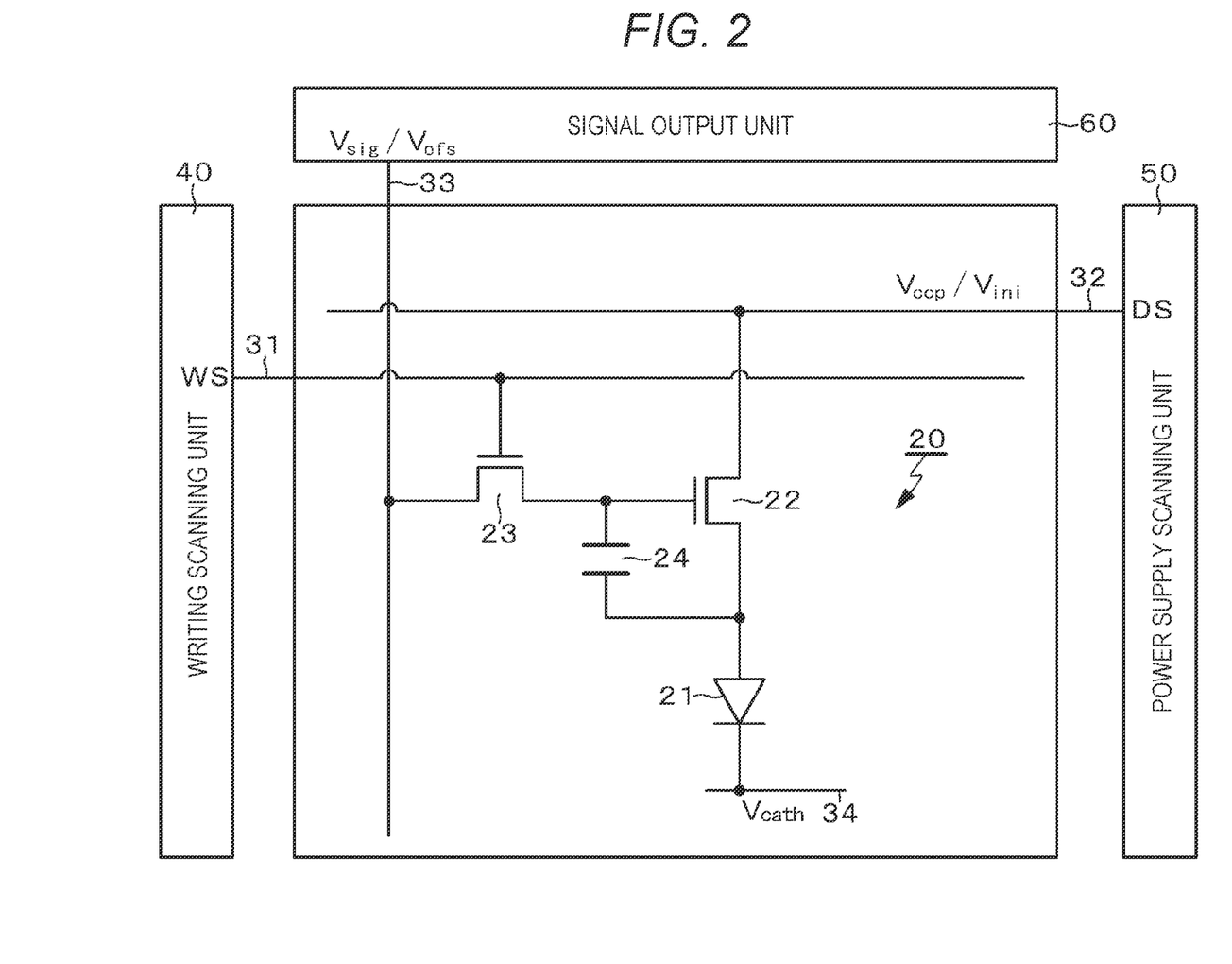
FIG. 2 is a circuit diagram showing a circuit configuration of a pixel (pixel circuit) of 2Tr1C in the active matrix type organic EL display device of the present disclosure.

FIG. 2 is a circuit diagram showing an example of a specific circuit configuration of the pixel (pixel circuit) 20. The light emitting unit of the pixel 20 includes the organic EL element 21 being an example of a current driven type electrooptic element in which the light emission luminance changes according to a current value flowing in the device.

As shown in FIG. 2, the pixel 20 includes an organic EL element 21 and a drive circuit for driving the organic EL element 21 by applying a current to the organic EL element 21. In the organic EL element 21, a cathode electrode is connected to a common power supply line 34 wired in common for all the pixels 20.

The driving circuit for driving the organic EL element 21 has a circuit configuration, so-called 2Tr1C, including the driving transistor 22, the writing transistor 23, and the holding capacitor 24, in other words, two transistors (Tr) and one capacitor element (C). Here, an N-channel thin film transistor (TFT) is used as the driving transistor 22 and the writing transistor 23. However, the combination of the conductivity types of the driving transistor 22 and the writing transistor 23 shown here is a merely example, and the combination is not limited thereto.

Note that, in the organic EL display device 10 of the present disclosure, the pixel (pixel circuit) 20 is formed not on an insulator such as a glass substrate but on a semiconductor such as silicon. In other words, the substrate on which the pixels 20 are two-dimensionally arranged is a semiconductor substrate.

In the driving transistor 22, one electrode (source/drain electrode) is connected to the power supply lines 32 ($32_1$ to $32_m$) and another electrode (source/drain electrode) is connected to the anode electrode of the organic EL element 21. In the writing transistor 23, one electrode (source/drain electrode) is connected to the signal lines 33 ($33_1$ to $33_n$) and another electrode (source/drain electrode) is connected to the gate electrode of the driving transistor 22. Furthermore, the gate electrode of the writing transistor 23 is connected to the scanning lines 31 ($31_1$ to $31_m$).

In the driving transistor 22 and the writing transistor 23, one electrode is a metal wiring electrically connected to one source/drain region, and another electrode is a metal wiring electrically connected to another source/drain region. Furthermore, depending on the potential relationship between one electrode and another electrode, one electrode may be the source electrode or the drain electrode in some cases, and another electrode may be the drain electrode or the source electrode in some cases.

One electrode of the holding capacitor 24 is connected to the gate electrode of the driving transistor 22 and another electrode is connected to another electrode of the driving transistor 22 and to the anode electrode of the organic EL element 21.

In the above configuration, the writing transistor 23 enters a conductive state in response to the writing scanning signal WS that is applied to the gate electrode from the writing scanning unit 40 through the scanning line 31 and in which the high voltage state corresponds to an active state. As a result, the writing transistor 23 samples the signal voltage $V_{sig}$ or the reference voltage $V_{ofs}$ of the video signal corresponding to the luminance information that is supplied from the signal output unit 60 at different timings through the signal line 33, and writes the signal voltage $V_{sig}$ or the reference voltage $V_{ofs}$ into the pixel 20. The signal voltage $V_{sig}$ or the reference voltage $V_{ofs}$ written by the writing transistor 23 is held in the holding capacitor 24.

When the power supply voltage DS of the power supply lines 32 ($32_1$ to $32_m$) is at the first power supply voltage $V_{ccp}$, the driving transistor 22 operates in a saturation region with one electrode serving as a drain electrode and another electrode serving as a source electrode. As a result, the driving transistor 22 receives a current supply from the power supply line 32 and drives the organic EL element 21 to emit light by current driving. More specifically, by operating in the saturation region, the driving transistor 22 supplies a driving current of a current value corresponding to the voltage value of the signal voltage $V_{sig}$ held in the holding capacitor 24 to the organic EL element 21, and drives the organic EL element 21 by current to emit light.

Moreover, when the power supply voltage DS is switched from the first power supply voltage $V_{ccp}$ to the second power supply voltage $V_{ini}$, the driving transistor 22 operates as a switching transistor with one electrode serving as a source electrode and another electrode serving as a drain electrode. As a result, the driving transistor 22 stops the supply of the driving current to the organic EL element 21, and sets the organic EL element 21 to the non-light emitting state. In other words, the driving transistor 22 also has a function as a transistor for controlling light emission/non-light emission of the organic EL element 21.

By the switching operation of the driving transistor 22, a period (non-light emitting period) during which the organic EL element 21 is in the non-light emitting state can be provided to control the ratio (duty) of the light emitting period and the non-light emitting period of the organic EL element 21. By this duty control, afterimage blurring caused by light emission of the pixels over one display frame period can be reduced, so that, in particular, image quality of moving images can be made more excellent.

Among the first power supply voltage $V_{ccp}$ and the second power supply voltage $V_{ini}$ selectively supplied from the power supply scanning unit 50 through the power supply line 32, the first power supply voltage $V_{ccp}$ is a power supply voltage for supplying the driving current for driving the organic EL element 21 to emit light to the driving transistor 22. Furthermore, the second power supply voltage $V_{ini}$ is a power supply voltage for applying a reverse bias to the organic EL element 21. The second power supply voltage $V_{ini}$ is set to a voltage lower than the reference voltage $V_{ofs}$, for example, when the threshold voltage of the driving transistor 22 is $V_{th}$, a voltage lower than $V_{ofs}-V_{th}$, preferably a voltage sufficiently lower than $V_{ofs}-V_{th}$.

Each of the pixels 20 of the pixel array unit 30 has a function of correcting variation in driving current caused by variation in characteristics of the driving transistor 22. As the characteristics of the driving transistor 22, for example, the threshold voltage $V_{th}$ of the driving transistor 22, and the mobility µ of the semiconductor thin film included in the channel of the driving transistor 22 (hereinafter simply referred to as "mobility µ of the driving transistor 22") can be exemplified.

The correction of the variation in the driving current caused by the variation in the threshold voltage $V_{th}$ (hereinafter referred to as "threshold correction") is performed by initializing the gate voltage $V_g$ of the driving transistor 22 to the reference voltage $V_{ofs}$. Specifically, with the initialization voltage (reference voltage $V_{ofs}$) of the gate voltage $V_g$ of the driving transistor 22 taken as a reference, the operation of changing the source voltage $V_s$ of the driving transistor 22 toward the potential obtained by subtracting the threshold voltage $V_{th}$ of the driving transistor 22 from the initialization voltage is performed. As the operation progresses, the gate-source voltage $V_{gs}$ of the driving transistor 22 eventually converges to the threshold voltage $V_{th}$ of the driving transistor 22. A voltage corresponding to this threshold voltage $V_{th}$ is held in the holding capacitor 24. Then, since the voltage corresponding to the threshold voltage $V_{th}$ is held in the holding capacitor 24, when the driving transistor 22 is driven by the signal voltage $V_{sig}$ of the video signal, dependency on the threshold voltage $V_{th}$ of the drain-source current $I_{ds}$ flowing in the driving transistor 22 can be suppressed.

On the other hand, the correction of the variation in the driving current caused by the variation in the mobility µ (hereinafter, referred to as "mobility correction") is performed by flowing the current via the driving transistor 22 to the holding capacitor 24 in a state where the writing transistor 23 is in the conductive state and the signal voltage $V_{sig}$ of the video signal is being written. In other words, the mobility correction is performed by applying negative feedback to the holding capacitor 24 with a feedback amount (correction amount) corresponding to the current $I_{ds}$ flowing in the driving transistor 22. Through the above-described threshold correction, when the video signal is written, the dependence on the threshold voltage $V_{th}$ of the drain-source current $I_{ds}$ has already been canceled, and the drain-source current $I_{ds}$ depends on the mobility µ of the driving transistor 22. Accordingly, negative feedback is applied to the drain-source voltage $V_{ds}$ of the driving transistor 22 with a feedback amount corresponding to the current $I_{ds}$ flowing in the driving transistor 22, so that the dependence on the mobility µ of the drain-source current $I_{ds}$ flowing in the driving transistor 22 can be suppressed.

[Holding Capacitor]

In the above-described active matrix type organic EL display device 10, as the number of pixels increases with higher definition, the size of the pixels 20 decreases. Furthermore, in a microdisplay (ultra-compact display device), as a matter of course, the size of the pixels 20 is smaller than that in a general display for application as a monitor. As described above, when the size of the pixels 20 is small, it is difficult to sufficiently secure the capacitance value of the holding capacitor 24.

As described above, the holding capacitor 24 is a capacitor element provided to hold the signal voltage $V_{sig}$ written by the writing transistor 23. Accordingly, if the capacitance value of the holding capacitor 24 cannot be secured, the signal voltage $V_{sig}$ written by the writing transistor 23 cannot be sufficiently held.

Furthermore, the capacitance value of the holding capacitor 24 can also affect bootstrap operation for keeping the light emission luminance of the organic EL element 21 constant even if the I (current) –V (voltage) characteristic of the organic EL element 21 varies with time. The "bootstrap operation" is operation in which the gate voltage $V_g$ of the driving transistor 22 fluctuates in conjunction with fluctuation of the source voltage $V_s$, in other words, operation in which, while the gate-source voltage $V_{gs}$ of the driving transistor 22 is kept constant, the gate voltage $V_g$ and the source voltage $V_s$ rise.

Here, the capacitance value of the holding capacitor 24 is defined as $C_s$, the parasitic capacitance between the gate and the source of the driving transistor 22 is defined as $C_{gs}$, the parasitic capacitance between the gate and the drain of the driving transistor 22 is defined as $C_{gd}$, and the parasitic capacitance between the gate-drain and the source of the writing transistor 23 is defined as $C_d$. Furthermore, the fluctuation component of the source voltage $V_s$ of the driving transistor 22 is defined as $\Delta V_s$, and the fluctuation component of the gate voltage $V_g$ is defined as $\Delta V_g$. Then, the ratio of the fluctuation component $\Delta V_g$ of the gate voltage $V_g$ with respect to the fluctuation component $\Delta V_s$ of the source voltage $V_s$ of the driving transistor, in other words, the bootstrap ratio $G_{bst}$ is represented by $$G_{bst}=\Delta V_g/\Delta V_s$$

$$=\{(C_s+C_{gs})/(C_s+C_{gs}+C_{gd}+C_d)\} \quad (1).$$

In the bootstrap operation, if the bootstrap ratio $G_{bst}$ is small, the fluctuation component $\Delta V_g$ of the gate voltage $V_g$ is smaller than the fluctuation component $\Delta V_s$ of the source voltage $V_s$, so that the gate-source voltage $V_{gs}$ is reduced. As a result, the gate-source voltage $V_{gs}$ becomes smaller than the signal voltage $V_{sig}$ held in the holding capacitor 24 by writing by the writing transistor 23. Then, it is impossible to secure a current required as a current to be supplied to the organic EL element 21, in other words, a current corresponding to the signal voltage $V_{sig}$ written by sampling by the writing transistor 23. As a result, the luminance decreases, and accordingly display unevenness occurs, which results in deterioration in display quality.

As apparent from the above equation (1), the bootstrap ratio $G_{bst}$ is determined by the capacitance value $C_s$ of the holding capacitor 24 and the parasitic capacitances $C_{gs}$, $C_{gd}$, $C_d$ attached to the gate electrode of the driving transistor 22. Accordingly, if the capacitance value $C_s$ of the holding capacitor 24 is large, the bootstrap ratio $G_{bst}$ becomes large, so that it is necessary to secure a large capacitance value $C_s$ of the holding capacitor 24 from the viewpoint of display quality.

Figure 3:
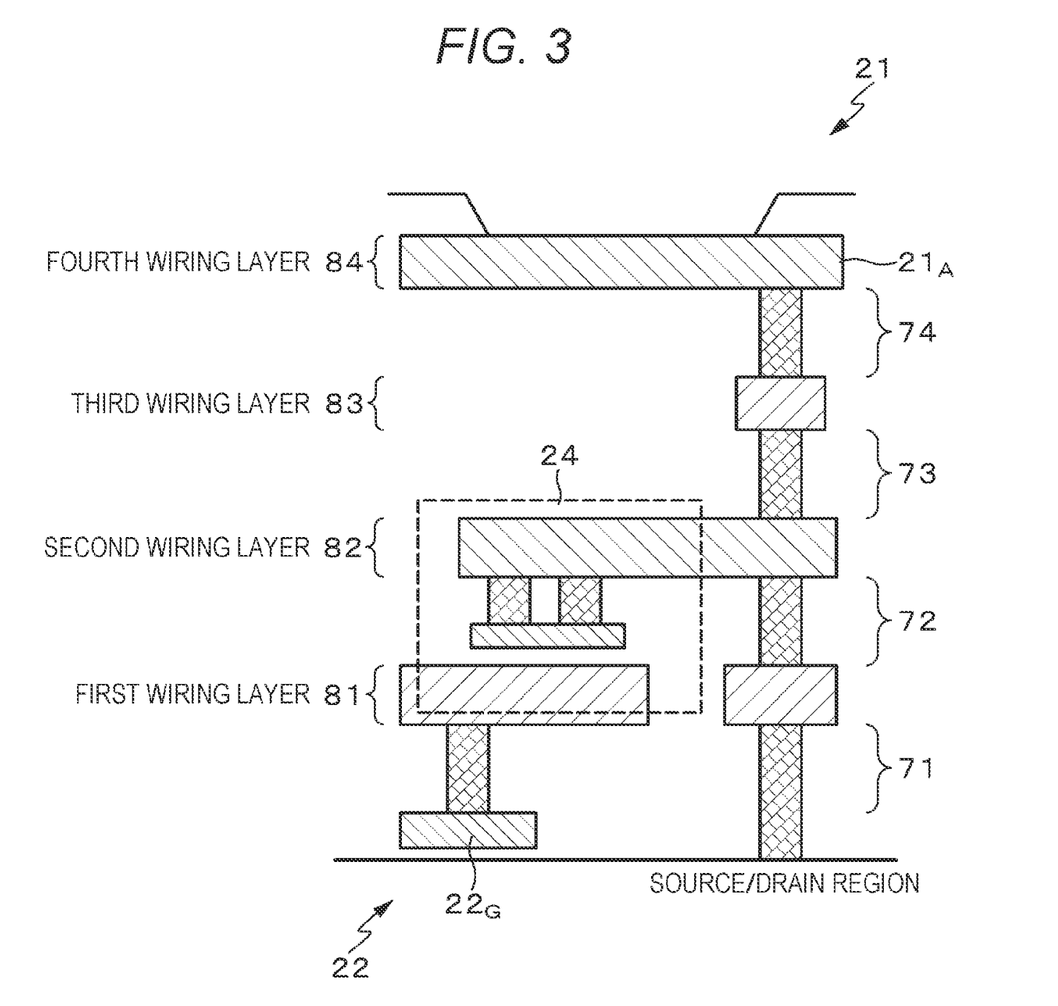
FIG. 3 is a cross-sectional view showing a sectional structure of a holding capacitor according to a conventional example.

As shown in FIG. 3, the organic EL display device 10 according to the present embodiment has a multilayer wiring structure formed by alternately stacking a plurality of insulating layers, for example, four insulating layers 71 to 74, and a plurality of wiring layers, for example, four wiring layers 81 to 84. Then, an anode electrode $21_A$ of the organic EL element 21 is formed on the fourth wiring layer 84 that is the uppermost layer of the multilayer wiring structure.

Example of Forming Capacitor Element Using Wiring Layer Right Above Gate Electrode Here, in the multilayer wiring structure, as shown in FIG. 3, a case where the holding capacitor 24 is formed by using the first wiring layer 81 right above the gate electrode $22_G$ of the driving transistor 22 will be considered as a conventional example. In the case of the conventional example, the first wiring layer 81 and the second wiring layer 82 form the holding capacitor 24 of a metal-insulator-metal (MIM) structure. In this case, in the first wiring layer 81 right above the gate electrode $22_G$ of the driving transistor 22, since the holding capacitor 24 is formed avoiding other gate wiring or the like, it is difficult to efficiently form the holding capacitor 24.

First Embodiment

Figure 4:
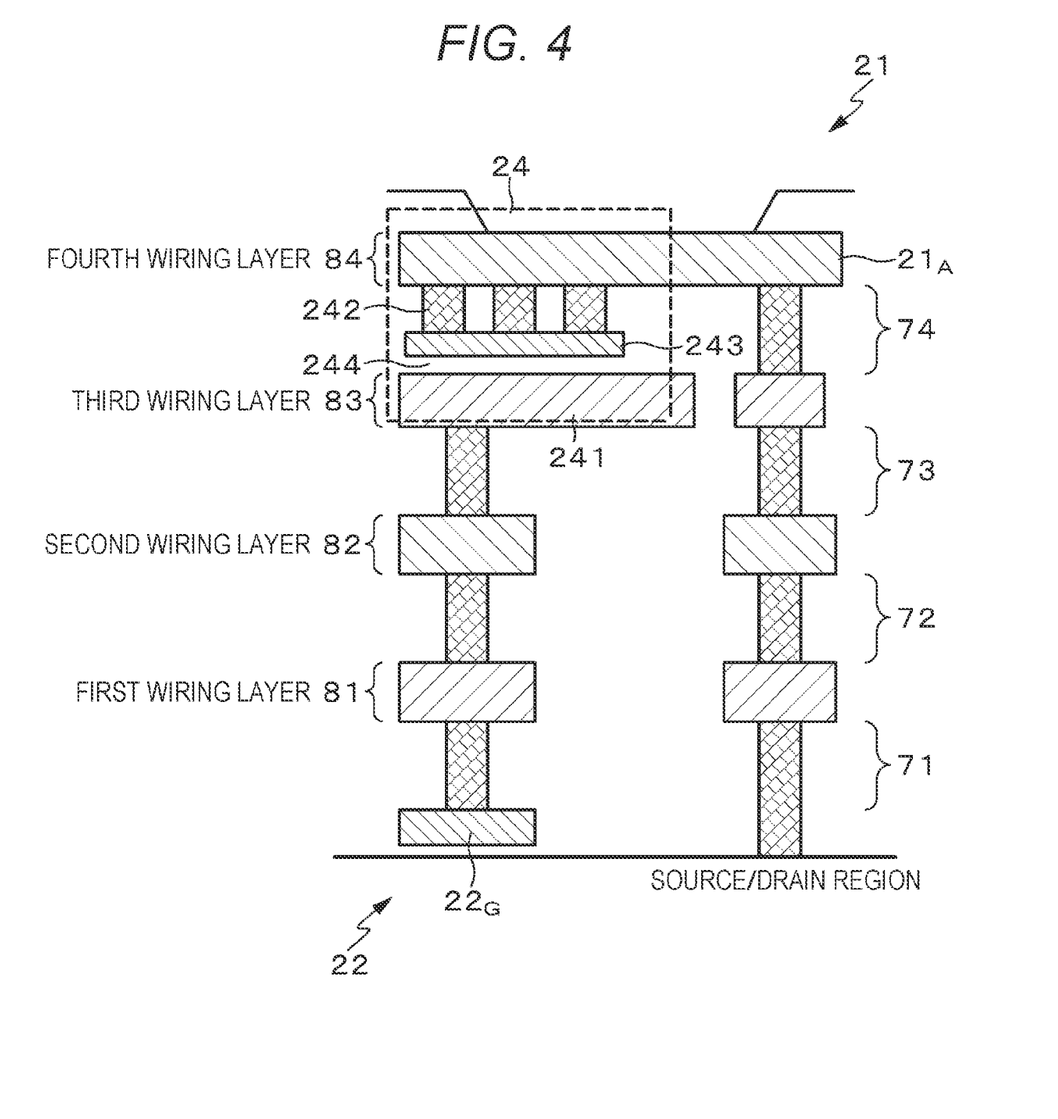
FIG. 4 is a cross-sectional view showing a sectional structure of a holding capacitor according to a first embodiment.

A first embodiment is an example in which the holding capacitor 24 having the MIM structure is formed using the anode electrode $21_A$ of the organic EL element 21. FIG. 4 shows a sectional structure of the holding capacitor 24 according to the first embodiment.

As shown in FIG. 4, the holding capacitor 24 according to the first embodiment includes a first electrode 241 formed in a wiring layer (third wiring layer 83) below the anode electrode $21_A$, and a second electrode 243 formed opposite to the first electrode 241 and is electrically connected to the anode electrode $21_A$ via a contact unit 242. Then, a dielectric 244 as a first insulating layer is interposed between the first electrode 241 and the second electrode 243. The dielectric 244 includes a material (for example, SiO) for forming the fourth insulating layer 74 or a high dielectric material (for example, SiN) different from the fourth insulating layer 74. As a result, the holding capacitor 24 having the MIM structure is formed using the anode electrode $21_A$ of the organic EL element 21.

As described above, the first electrode 241 is formed in a wiring layer below the anode electrode $21_A$, and the second electrode 243 is electrically connected to the anode electrode $21_A$ via the contact unit 242, so that a region below the anode electrode $21_A$ can be efficiently used to form the holding capacitor 24. Furthermore, the length of the contact unit 242 is adjusted and an interval between the first electrode 241 and the second electrode 243 is arbitrarily set, so that the holding capacitor 24 having a desired capacitance value can be easily formed. As a result, deterioration in display quality due to insufficient capacity of the holding capacitor 24 can be suppressed.

Second Embodiment

Figure 5:
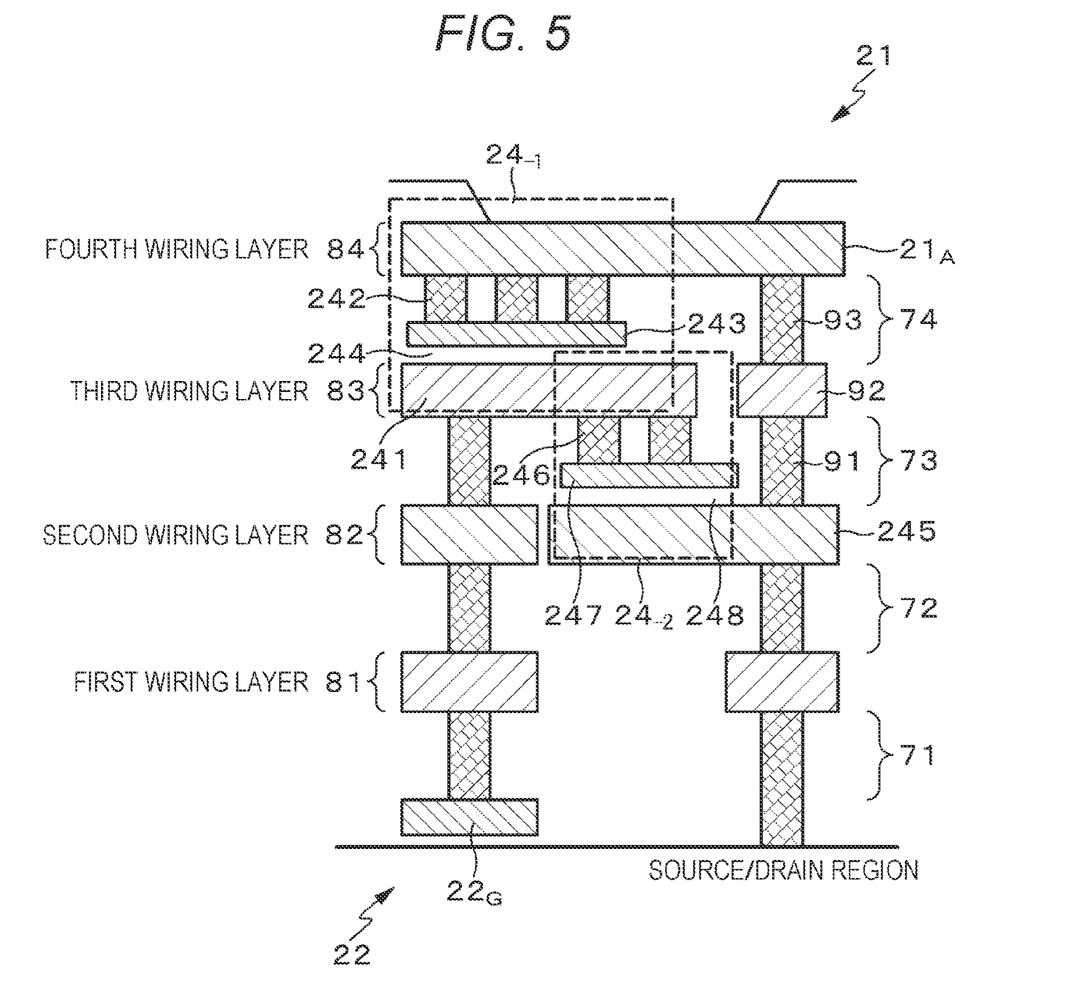
FIG. 5 is a cross-sectional view showing a sectional structure of a holding capacitor according to a second embodiment.

A second embodiment is a modification of the first embodiment, and is an example in which the holding capacitor 24 includes two capacitor elements. FIG. 5 shows a sectional structure of the holding capacitor 24 according to the second embodiment.

In FIG. 5, if the holding capacitor 24 according to the first embodiment is a first capacitor element $24_{-1}$, the holding capacitor 24 according to the second embodiment includes, in addition to the first capacitor element $24_{-1}$, a second capacitor element $24_{-2}$, and the first capacitor element $24_{-1}$ and the second capacitor element $24_{-2}$ are connected in parallel. The first capacitor element $24_{-1}$ and the second capacitor element $24_{-2}$ are connected in parallel, so that, in the case of the first capacitor element $24_{-1}$ alone, in other words, the capacitance value of the holding capacitor 24 according to the second embodiment can be set to be larger than the holding capacitor 24 according to the first embodiment.

Specifically, as similar to the holding capacitor 24 according to the first embodiment, the first capacitor element $24_{-1}$ includes a first electrode 241 formed in a wiring layer (third wiring layer 83) below the anode electrode $21_A$, and a second electrode 243 formed opposite to the first electrode 241. Then, the first capacitor element $24_{-1}$ has the MIM structure in which a material for forming the fourth insulating layer 74 or the dielectric material 244 including a high-dielectric material different from the fourth insulating layer 74 is interposed between the first electrode 241 and the second electrode 243. In the first capacitor element $24_{-1}$ having the MIM structure, the length of the contact unit 242 is adjusted and an interval between the first electrode 241 and the second electrode 243 is arbitrarily set, so that the first capacitor element $24_{-1}$ having a desired capacitance value can be easily formed.

While the first capacitor element $24_{-1}$ is formed by using the anode electrode $21_A$ of the organic EL element 21, the second capacitor element $24_{-2}$ is formed by using a wiring layer right below the anode electrode $21_A$ (the second wiring layer 82 and the third wiring layer 83). Specifically, the second capacitor element $24_{-2}$ includes a third electrode 245 formed in a wiring layer (second wiring layer 82) below the first electrode 241, and a fourth electrode 247 formed opposite to the third electrode 245 and is electrically connected to the first electrode 241 via a contact unit 246. Then, a dielectric 248 as a second insulating layer is interposed between the third electrode 245 and the fourth electrode 247. The dielectric 248 includes a material (for example, SiO) for forming the third insulating layer 73 or a high dielectric material (for example, SiN) different from the third insulating layer 73. In the second capacitor element $24_{-2}$ having the MIM structure, the length of the contact unit 246 is adjusted and an interval between the third electrode 245 and the fourth electrode 247 is arbitrarily set, so that the second capacitor element $24_{-2}$ having a desired capacitance value can be easily formed.

In the second capacitor element $24_{-2}$ having the above configuration, the third electrode 245 is electrically connected to the anode electrode $21_A$ via the contact unit 91, the island shaped relay electrode 92, and the contact unit 93. Furthermore, the fourth electrode 247 is electrically connected to the second electrode 243 through a wiring (not shown). As a result, the second capacitor element $24_{-2}$ is connected in parallel to the first capacitor $24_{-1}$.

As described above, the holding capacitor 24 according to the second embodiment uses the anode electrode $21_A$ to form the first capacitor element $24_{-1}$ having the MIM structure, and uses the wiring layer right below the anode electrode $21_A$ to form the second capacitor element $24_{-2}$ having the MIM structure, and both elements $24_{-1}$ and $24_{-2}$ are connected in parallel. This makes it possible to efficiently use the region below the anode electrode $21_A$ to form the holding capacitor 24 and to set the capacitance value of the holding capacitor 24 according to the second embodiment to be larger than in the case of the first capacitor element $24_{-1}$ alone. As a result, deterioration in display quality due to insufficient capacity of the holding capacitor 24 can be suppressed.

Third Embodiment

Figure 6:
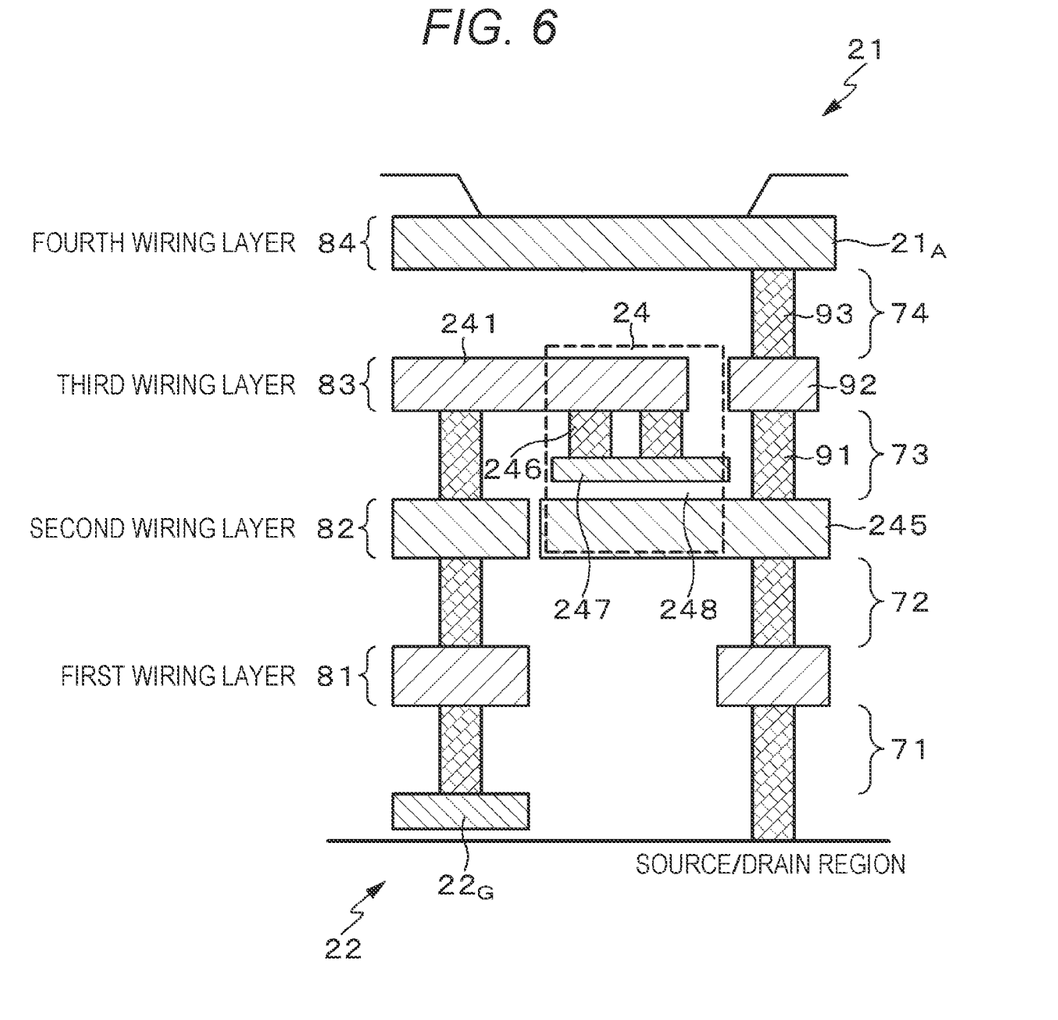
FIG. 6 is a cross-sectional view showing a sectional structure of a holding capacitor according to a third embodiment.

A third embodiment is a modification of the second embodiment, and is an example in which only the second capacitor element $24_{-2}$ of the second embodiment is used as the holding capacitor 24. FIG. 6 shows a sectional structure of the holding capacitor 24 according to the third embodiment.

As shown in FIG. 6, the holding capacitor 24 according to third embodiment has a configuration including a capacitor element having the MIM structure formed using a wiring layer (the second wiring layer 82 and the third wiring layer 83) right below the anode electrode $21_A$ of the organic EL element 21.

As described above, the holding capacitor 24 having the MIM structure using the wiring layer right below the anode electrode $21_A$ is formed, so that the region below the anode electrode $21_A$ can be efficiently used to form the holding capacitor 24 having a desired capacitance value as compared with the case of using the wiring layer (the first wiring layer 81) right above the gate electrode $22_G$ to form the holding capacitor 24 (see FIG. 3). As a result, deterioration in display quality due to insufficient capacity of the holding capacitor 24 can be suppressed as similar to the case of the first and second embodiments.

<Modification>

Although the technology of the present disclosure has been described above on the basis of the preferred embodiments, the technique of the present disclosure is not limited to the embodiments. The configuration and structure of the display device described in each of the above embodiments are illustrative and can be changed as appropriate. For example, in each of the above embodiments, a pixel circuit having a circuit configuration of 2Tr1C is exemplified. However, the pixel circuit is not limited to a circuit configuration of 2Tr1C, and a transistor (Tr) or a capacitor element (C) can be increased as needed.

<Electronic Device of the Present Disclosure>

The display device according to the present disclosure described above can be used as a display unit (display device) of an electronic device in any fields that displays a video signal input to an electronic device or a video signal generated in the electronic device as an image or video. Examples of the electronic device can include a television set, a notebook personal computer, a digital still camera, a mobile terminal device such as a mobile phone, a head mount display, and the like. However, the electronic device is not limited to these.

As described above, the following effects can be obtained by using the display device of the present disclosure as a display unit in electronic devices of any fields. In other words, according to the display device of the present disclosure, deterioration in display quality due to insufficient capacity of the holding capacitor 24 can be suppressed. Accordingly, the display device of the present disclosure is used as a display unit (display device) of the electronic device, and thereby, the display quality of the display image can be improved.

The display device of the present disclosure also includes a module shape of a sealed configuration. Examples of such a display device include a display module formed by affixing a facing unit such as transparent glass to a pixel array unit. Note that the display module may be provided with a circuit unit for inputting and outputting a signal or the like from the outside to the pixel array unit, a flexible printed circuit (FPC), or the like. Hereinafter, a digital still camera and a head mounted display will be exemplified as specific examples of the electronic device using the display device of the present disclosure. However, the specific examples illustrated here are merely examples, and the present invention is not limited thereto.

Specific Example 1

Figure 7A:
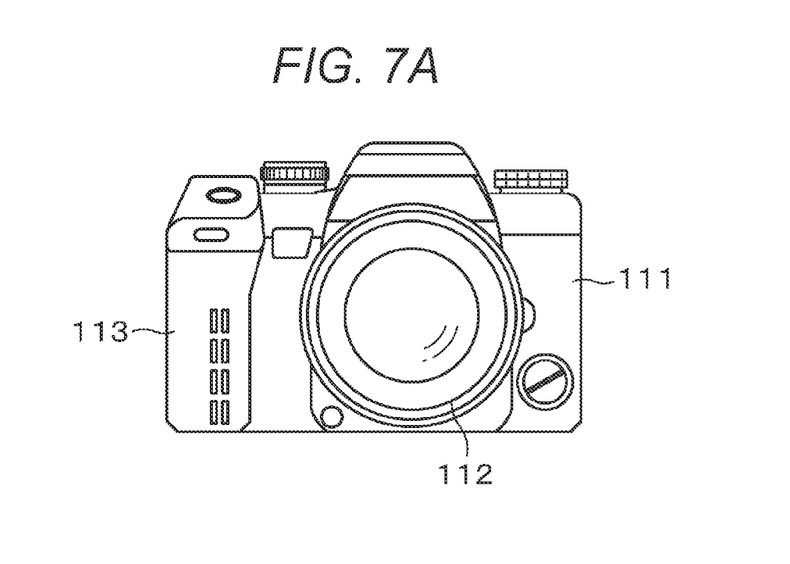
FIG. 7A and FIG. 7B are a front view and a rear view of a lens interchangeable single lens reflex type digital still camera.
Figure 7B:
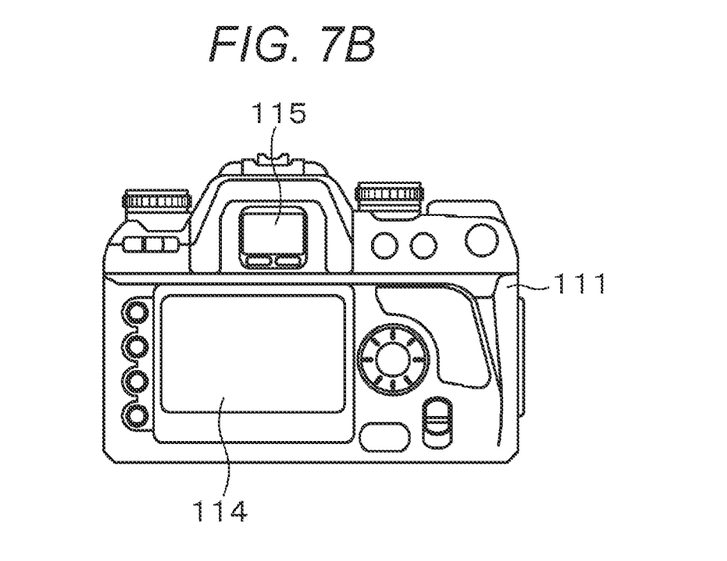

FIG. 7 is an external view of a lens interchangeable single lens reflex type digital still camera, FIG. 7A is a front view thereof, and FIG. 7B is a rear view thereof. A lens interchangeable single lens reflex type digital still camera has, for example, an interchangeable photographic lens unit (interchangeable lens) 112 on the front right side of a camera body unit (camera body) 111, and a grip unit 113 that is gripped by a photographer on the front left side.

Then, a monitor 114 is provided substantially at the center of the rear surface of the camera body unit 111. An electronic view finder (eyepiece window) 115 is provided on the upper portion of the monitor 114. By looking into an electronic view finder 115, the photographer can visually recognize an optical image of a subject introduced from the photographing lens unit 112 and determine the composition.

In the lens interchangeable single lens reflex type digital still camera having the above configuration, the display device of the present disclosure can be used as the electronic view finder 115. In other words, the lens interchangeable single lens reflex type digital still camera according to the present example is manufactured by using the display device of the present disclosure as the electronic view finder 115.

Specific Example 2

Figure 8:
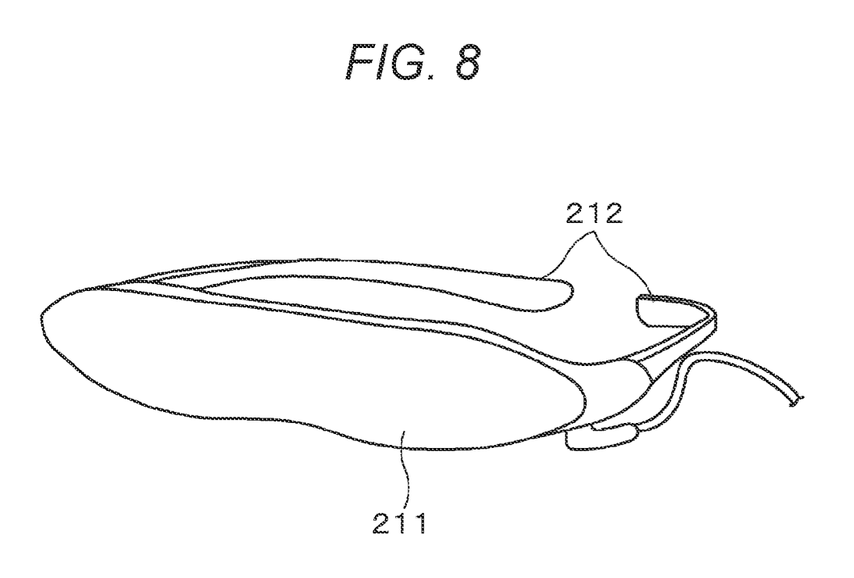
FIG. 8 is an external view of a head mounted display.

FIG. 8 is an external view of a head mounted display. The head mount display has, for example, an ear hanger 212 worn in the head of a user, on both sides of a glasses-shaped display unit 211. In this head mounted display, the display device of the present disclosure can be used as the display unit 211. In other words, the head mounted display according to the present example is manufactured by using the display device of the present disclosure as the display unit 211.

<Configuration that the Present Disclosure can Have>

Note that, the present disclosure can also have the following configuration.

[1] A display device including a pixel arranged therein, the pixel including a light emitting unit in which an anode electrode is formed in the uppermost layer of a multilayer wiring structure formed by alternately stacking a plurality of insulating layers and a plurality of wiring layers and a capacitor element electrically connected to the anode electrode of the light emitting unit, the capacitor element including a first electrode formed in a wiring layer below the anode electrode, a second electrode formed opposite to the first electrode, and electrically connected to the anode electrode of the light emitting unit via a contact unit, and a first insulating layer interposed between the first electrode and the second electrode.

[2] The display device described in [1] above, in which the capacitor element includes:

a third electrode formed in a wiring layer below the first electrode;

a fourth electrode formed opposite to the third electrode, and electrically connected to the first electrode via the contact unit; and a second insulating layer interposed between the third electrode and the fourth electrode, the third electrode is electrically connected to the anode electrode, and the fourth electrode is electrically connected to the second electrode.

[3] The display device described in [1] or [2] above, in which the pixel includes a driving transistor that drives the light emitting unit, and a writing transistor that writes a signal to a gate electrode of the driving transistor, and the capacitor element is connected between the gate electrode of the driving transistor and the anode electrode of the light emitting unit, and holds the signal written by the writing transistor.

[4] The display device described in any of [1] to [3] above, in which a substrate on which the pixels are two-dimensionally arranged is a semiconductor substrate.

[5] The display device described in any of [1] to [4] above, in which the light emitting unit includes an organic electroluminescence element.

[6] An electronic device including a display device, the display device including a pixel arranged therein, the pixel including a light emitting unit in which an anode electrode is formed in the uppermost layer of a multilayer wiring structure formed by alternately stacking a plurality of insulating layers and a plurality of wiring layers, and a capacitor element electrically connected to the anode electrode of the light emitting unit, the capacitor element including a first electrode formed in a wiring layer below the anode electrode, a second electrode formed opposite to the first electrode, and electrically connected to the anode electrode of the light emitting unit via a contact unit, and a first insulating layer interposed between the first electrode and the second electrode.

REFERENCE SIGNS LIST

10 Organic EL display device
20 Pixel (pixel circuit)
21 ($21R$, $21G$, $21B$) Organic EL element
22 Driving transistor
23 Writing transistor
24 Holding capacitor
30 Pixel array unit
31 ($31_1$ to $31_m$) Scanning line
32 ($32_1$ to $32_m$) Power supply line
33 ($33_1$ to $33_n$) Signal line
34 Common power supply line
40 Writing scanning unit
50 Power supply scanning unit
60 Signal output unit
70 Display panel
81 First wiring layer
82 Second wiring layer
83 Third wiring layer
84 Fourth wiring layer

The invention claimed is:

1. A display device comprising:

a plurality of pixel circuits arranged in a matrix, wherein each of the pixel circuits includes:

a light emitting element;

a capacitance component;

a sampling transistor configured to supply a data voltage supplied from a data signal line to the capacitance component; and a drive transistor configured to supply driving current to the light emitting element according to a voltage stored in the capacitance component, wherein the capacitance component includes a first capacitive element and a second capacitive element connected in parallel to the first capacitive element, an anode electrode is formed in a first layer, the first capacitive element includes a first electrode formed in a second layer arranged under the first layer and connected to a gate of the drive transistor, and a second electrode opposed to the first electrode, the second capacitive element includes a third electrode formed in a third layer arranged under the second layer, and a fourth electrode opposed to the third electrode and connected to the first electrode, and the second electrode and the third electrode are electrically directly connected to the anode electrode.

2. The display device according to claim 1, wherein the second electrode is electrically connected to the third electrode.

3. The display device according to claim 1, wherein the first electrode is electrically connected to the fourth electrode via a plurality of contacts.

4. The display device according to claim 1, wherein the fourth electrode is formed below the first electrode.

5. The display device according to claim 1, wherein at least a part of a first region where a gate of the drive transistor is formed overlaps with at least a part of a second region where the first electrode is formed in a plan view.

6. The display device according to claim 1, wherein at least a part of a first region where a gate of the drive transistor is formed overlaps with at least a part of a third region where the second electrode is formed in a plan view.

7. The display device according to claim 1, wherein at least a part of a second region where the first electrode is formed overlaps with at least a part of a fourth region where the third electrode is formed in a plan view.

8. The display device according to claim 1, wherein at least a part of a second region where the first electrode is formed overlaps with at least a part of a fifth region where the fourth electrode is formed in a plan view.

9. The display device according to claim 1, wherein each of the first capacitive element and the second capacitive element is a MIM (Metal-Insulator-Metal) capacitor.

10. An electronic apparatus comprising the display device according to claim 1.

11. The electronic apparatus according to claim 10, wherein the second electrode is electrically connected to the third electrode.

12. The electronic apparatus according to claim 11, wherein the second electrode and the third electrode are electrically connected to the anode electrode.

13. The electronic apparatus according to claim 10, wherein the first electrode is electrically connected to the fourth electrode via a plurality of contacts.

14. The electronic apparatus according to claim 10, wherein the fourth electrode is formed below the first electrode.

15. The electronic apparatus according to claim 10, wherein at least a part of a first region where a gate of the drive transistor is formed overlaps with at least a part of a second region where the first electrode is formed in a plan view.

16. The electronic apparatus according to claim 10, wherein at least a part of a first region where a gate of the drive transistor is formed overlaps with at least a part of a third region where the second electrode is formed in a plan view.

17. The electronic apparatus according to claim 10, wherein at least a part of a second region where the first electrode is formed overlaps with at least a part of a fourth region where the third electrode is formed in a plan view.

18. The electronic apparatus according to claim 10, wherein at least a part of a second region where the first electrode is formed overlaps with at least a part of a fifth region where the fourth electrode is formed in a plan view.

19. The electronic apparatus according to claim 10, wherein each of the first capacitive element and the second capacitive element is a MIM (Metal-Insulator-Metal) capacitor.

\* \* \* \* \*